United States Patent
Qi et al.

(10) Patent No.: US 8,571,112 B2
(45) Date of Patent: Oct. 29, 2013

(54) SPECIFICATION METHOD AND APPARATUS FOR CODING AND DECODING

(75) Inventors: Fengyan Qi, Shenzhen (CN); Lei Miao, Shenzhen (CN); Qing Zhang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 592 days.

(21) Appl. No.: 12/778,644

(22) Filed: May 12, 2010

(65) Prior Publication Data

US 2010/0290535 A1  Nov. 18, 2010

(30) Foreign Application Priority Data

May 12, 2009 (CN) .......................... 2009 1 0138674
Jun. 25, 2009 (CN) .......................... 2009 1 0151836

(51) Int. Cl.
*G10L 19/00* (2013.01)
(52) U.S. Cl.
USPC ...................................... 375/240.25; 704/201
(58) Field of Classification Search
USPC ...................................... 375/240.25; 704/201
See application file for complete search history.

(56) References Cited

U.S. PATENT DOCUMENTS

| 7,209,056 B2 * | 4/2007 | Moriya et al. ................... 341/51 |
| 2004/0044534 A1 | 3/2004 | Chen et al. |
| 2005/0030207 A1 | 2/2005 | Craven et al. |
| 2009/0018823 A1 * | 1/2009 | Taddei et al. ................. 704/201 |

FOREIGN PATENT DOCUMENTS

| CN | 101312041 A | 11/2008 |
| GB | 2164817 A | 3/1986 |
| JP | 1171324 A | 7/1998 |
| WO | 0011648 A1 | 3/2000 |
| WO | 0068935 A1 | 11/2000 |
| WO | 2005032035 A1 | 4/2005 |
| WO | 2008058754 A2 | 5/2008 |

OTHER PUBLICATIONS

Digital Cellular Telecommunications System (Phase 2+); Universal Mobile Telecommunications Systems (UMTS); Mandatory Speech Codec Speech Processing Functions AMR Wideband Speech Codec; Transcoding Functions (3GPP TS 26.190 Version 6.0 Release 6) Global System for Mobile Communications ETSI TS 126 190, Dec. 2004, pp. 1-55.

(Continued)

*Primary Examiner* — Christopher S Kelley
*Assistant Examiner* — Xiaolan Xu (57) ABSTRACT

A coding method, a decoding method, a coding apparatus, and a decoding apparatus are disclosed herein. A coding method includes: obtaining a value of each sample of an input data frame; determining pulse samples and non-pulse samples in the input data frame according to the distribution of values of samples of the input data frame; encoding the determined pulse samples in the input data frame in a first coding mode to obtain a first data stream; encoding the determined non-pulse samples in the input data frame in a second coding mode to obtain a second data stream; and multiplexing the first data stream and the second data stream to obtain an output coded data stream of the input data frame. Compared with the prior art, the technical solution under the present disclosure reduces the number of bits required for encoding the entire data frame is reduced, and improves the compression efficiency of the data frame with a wide dynamic range.

4 Claims, 5 Drawing Sheets

(56) References Cited

OTHER PUBLICATIONS

General Aspects of Digital Transmission Systems Terminal Equipments, Pulse Code Modulation (PCM) of Voice Frequencies, ITUT G. 711, Nov. 1988, pp. 1-12.

Foreign Communication From a Related Counterpart Application, European Application 10162750.3, Extended European Search Report dated Aug. 16, 2010, pp. 1-7.
Foreign Communication From A Related Counterpart Application, European Application 12183174.7, Extended European Search Report dated Oct. 30, 2012, pp. 1-7.

* cited by examiner

SPECIFICATION METHOD AND APPARATUS FOR CODING AND DECODING

CROSS-REFERENCE TO RELATED APPLICATIONS

This application claims priority to Chinese Patent Application No. 200910138674.7, filed on May 12, 2009, and Chinese Patent Application No. 200910151836.0, filed on Jun. 25, 2009, both of which are hereby incorporated by reference in their entireties.

FIELD OF THE DISCLOSURE

The present disclosure relates to communications technologies, and in particular, to a coding method, a decoding method, a coding apparatus, and a decoding apparatus.

BACKGROUND

Lossless compression makes use of the statistical redundancy of data. Compared with lossy compression, lossless compression recovers original data exactly without any distortion. The common compression software such as WinZip and WinRAR is based on the lossless compression technology. With the increase of user demand for high-definition media, the lossless compression technology is increasingly applied to audio and video coding.

Taking audio coding as an example, in the prior art, a common solution to audio coding is dynamic range coding. That is, the coding is performed according to the difference between the maximum sample value and the minimum sample value of each data frame (that is, data block) in the audio signal. The basic process is as follows: Analyze an input signal to obtain all the values of the samples of the input signal; calculate the dynamic range of data frame n ($frame_n$), namely, the difference between the maximum sample value and the minimum sample value in this data frame; then determine the number of bits ($b_n$) required for coding the samples of this data frame according to the dynamic range. In the coding, use $b_n$ bits to encode the difference between each sample value and the minimum value in $frame_n$; and finally, multiplex the coding values of all the samples of $frame_n$ and the minimum sample value of the data as the coding output of the data frame.

The prior art has at least these defects: In the foregoing dynamic range coding scheme, when the dynamic range of the data frame is small, a great compression ratio can be obtained; but if the dynamic range of the data frame is great, a large number of bits need to be used for coding for each sample of the frame, which affects the compression efficiency.

SUMMARY

A coding method in an embodiment of the present disclosure includes:
obtaining a value of each sample of an input data frame;
determining pulse samples and non-pulse samples in the input data frame according to the distribution of values of samples of the input data frame;
encoding the determined pulse samples in the input data frame in a first coding mode to obtain a first data stream;
encoding the determined non-pulse samples in the input data frame in a second coding mode to obtain a second data stream; and
multiplexing the first data stream and the second data stream to obtain an output coded data stream of the input data frame.

Accordingly, a decoding method in an embodiment of the present disclosure includes:
obtaining a coded data stream of a data frame;
decoding the coded data stream in a first coding mode to obtain pulse sample information of the data frame; and decoding the coded data stream in a second coding mode to obtain non-pulse sample information of the data frame; and
reconstructing the data frame according to the pulse sample information and the non-pulse sample information, wherein:
pulse samples and the non-pulse samples are determined by a coder according to the distribution of values of the samples of an input data frame.

A coding apparatus in an embodiment of the present disclosure includes:
an analyzing unit, adapted to obtain a value of each sample of an input data frame;
a sample sorting unit, adapted to determine pulse samples and non-pulse samples in the input data frame according to the distribution of values of samples of the input data frame;
a first coding unit, adapted to encode the determined pulse samples in the input data frame in a first coding mode to obtain a first data stream;
a second coding unit, adapted to encode the determined non-pulse samples in the input data frame in a second coding mode to obtain a second data stream; and
a multiplexing unit, adapted to multiplex the first data stream and the second data stream to obtain an output coded data stream of the input data frame.

Accordingly, a decoding apparatus in an embodiment of the present disclosure includes:
an inputting unit, adapted to obtain a coded data stream of a data frame;
a first decoding unit, adapted to decode the coded data stream in a first coding mode to obtain pulse sample information of the data frame;
a second decoding unit, adapted to decode the coded data stream in a second coding mode to obtain non-pulse sample information of the data frame; and
a reconstructing unit, adapted to reconstruct the data frame according to the pulse sample information and the non-pulse sample information, wherein:
pulse samples and the non-pulse samples are determined by a coder according to the distribution of values of the samples of an input data frame.

In the technical solution provided herein, the distribution of the values of the samples of the input data frame is analyzed, and the samples in the data frame are then sorted into pulse samples and non-pulse samples, which are encoded separately; finally, the coding results of the two types of samples are multiplexed to obtain the output coded data stream of the input data frame. In this way, the number of bits required for coding the entire data frame is reduced, and the efficiency of compressing the data frame with a wide dynamic range is improved.

BRIEF DESCRIPTION OF THE DRAWINGS

To make the technical solution under the present disclosure clearer, the accompanying drawings for illustrating the embodiments of the present disclosure or the prior art are outlined below. Evidently, the accompanying drawings are for the exemplary purpose only, and those skilled in the art

DETAILED DESCRIPTION OF THE EMBODIMENTS

The technical solution under the present disclosure is expounded below with reference to the accompanying drawings. Evidently, the embodiments given herein are for the exemplary purpose only, and are not all of the embodiments of the present disclosure. Additionally, all other embodiments, which can be derived by those skilled in the art from the embodiments given herein without any creative efforts, fall within the scope of the present disclosure.

A lossless compression coding method in an embodiment of the present disclosure is described below. The method includes:

obtaining a value of each sample of an input data frame;

determining pulse samples and non-pulse samples in the input data frame according to the distribution of values of samples of the input data frame;

encoding the determined pulse samples in the input data frame in a first coding mode to obtain a first data stream;

encoding the determined non-pulse samples in the input data frame in a second coding mode to obtain a second data stream; and multiplexing the first data stream and the second data stream to obtain an output coded data stream of the input data frame.

In the existing dynamic range coding scheme, the number of bits required for coding the samples of the data frame is determined according to the difference between the maximum sample value and the minimum sample value of each data frame, without considering the distribution of the values of the samples of the data frame. Consequently, the efficiency of encoding the data frame with a wide dynamic range is low. Taking the audio coding as an example, many data frames in the audio signals have the following characteristics: A majority of samples in the data frame are centralized to a few values, and the values of only a few samples are different from the values of other samples. The few samples tend to increase the overall dynamic range of the frame. Consequently, many bits are required for encoding each sample of the frame, thus leading to waste of the codeword resources.

In the technical solution provided herein, the distribution of the values of the samples of the input data frame is analyzed, and the samples in the data frame are then sorted into pulse samples and non-pulse samples, which are encoded separately; finally, the coding results of the two types of samples are multiplexed to obtain the output coded data stream of the input data frame. If most samples in the input data frame are non-pulse samples, after the pulse samples are excluded, the dynamic range of the non-pulse samples is controlled, and therefore the number of bits required for encoding each non-pulse sample is reduced. Meanwhile, for the few pulse samples which may increase the dynamic range of the entire data frame, few bits may be used to encode them separately. Compared with the prior art, the technical solution under the present disclosure reduces the number of bits required for encoding the entire data frame, and thus improves the compression efficiency.

The embodiments of the present disclosure are elaborated below with reference to the accompanying drawings.

Embodiment 1

Figure 1:
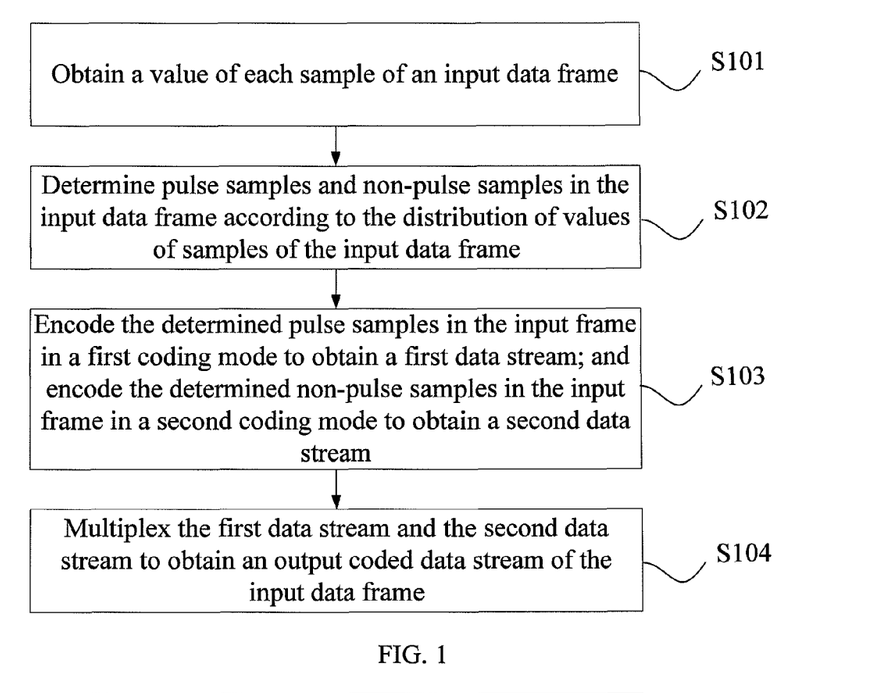
FIG. 1 is a flowchart of a coding method in the first embodiment of the present disclosure.

FIG. 1 is a flowchart of a lossless compression coding method in the first embodiment of the present disclosure. The method includes the following steps:

S101: Obtain a value of each sample of an input data frame.

In the technical solution under the present disclosure, the input data is encoded per frame. A data frame is composed of several samples, and each sample has a value. In this step, a coder obtains the value of each sample after receiving a data frame.

S102: Determine pulse samples and non-pulse samples in the input data frame according to the distribution of values of samples of the input data frame.

Many data frames in audio signals have the following characteristics: A majority of samples in the data frame are centralized to a few values, and the values of only a few samples are different from the values of other samples. In view of such characteristics, the samples are sorted into two types in this embodiment, and the two types of samples are encoded differently. In a data frame, the few samples, whose values are different from the values of other samples, are called pulse samples, and the remaining samples are called non-pulse samples.

To identify pulse samples and non-pulse samples in a data frame, it is necessary to determine the values which occur frequently in the data frame. The frequently occurring sample values may be predetermined according to the empirical data of the sample value distribution. For example, the ITU-T G.711 standard uses A-law or μ law to encode audios. For the coded streams under the ITU-T G.711 standard, it is highly probable that a sample value is positive zero or negative zero (positive zero or negative zero is defined in the A-law or μ law). Therefore, let: V0=positive zero, and V1=negative zero.

Then, the samples whose values are unequal to V0 and unequal to V1 in the input data frame are counted. If the number of such samples is less than a preset threshold K which is an integer greater than 1, such samples are determined as pulse samples, and the samples equal to V0 or V1 are determined as non-pulse samples. To ensure the coding efficiency, the value K is not very great; or further, the samples finally determined as pulse samples in the data frame do not exceed a specific proportion. The method of selecting the value K is detailed herein later.

In addition, the values of V0 and V1 may be determined in real time according to the distribution of the values of the samples of the input data frame. For example, the input data frame "frame$_n$" includes ten samples, and their values are 0 2 2 2 3 0 0 4 2 0. The two sample values that occur the most frequently in this data frame are 0 and 2. Let: V0=0 and V1=2.

In this example, the number of samples whose values are unequal to V0 and unequal to V1 is 2 (namely, the samples whose values are 3 or 4). If the number 2 is less than the preset threshold K, the two samples whose values are 3 or 4 are determined as pulse samples, and the samples whose values are 0 or 2 are determined as non-pulse samples.

It is noted that the following scenario may occur in this step: The number of samples whose values are unequal to V0 and unequal to V1 is 0. In this case, because 0 is surely less than K, the samples whose values are equal to V0 or V1 are still determined as non-pulse samples, and it is deemed that the number of determined pulse samples is 0.

S103: Encode the determined pulse samples in the input frame in a first coding mode to obtain a first data stream; and encode the determined non-pulse samples in the input frame in a second coding mode to obtain a second data stream.

Taking the $frame_n$ in S102 as an example, after the pulse samples are excluded, the remaining non-pulse sample sequence is 0 2 2 2 0 0 2 0. The amplitude of each non-pulse sample may be encoded in the second coding mode. In this embodiment, the non-pulse samples have two types of amplitudes. Therefore, 1 bit may be used to encode each non-pulse sample, namely, perform bi-level coding for the non-pulse samples. For example, the sample whose value is equal to 0 is encoded into 0, and the sample whose value is equal to 2 is encoded into 1. Therefore, after the non-pulse samples are encoded, the second data stream is 0 1 1 1 0 0 1 0, which includes 8 bits in total.

The amplitude of a pulse sample and the relative position of the pulse sample in the original data frame may be encoded in the first coding mode, as detailed below:

(1) Encoding the Amplitude of a Pulse Sample

The number a of bits required for encoding the amplitude of each pulse sample is calculated. The most simple calculation method is to find the pulse sample whose amplitude has the maximum absolute value. The number of bits required for encoding the amplitude of this sample is used as the number of bits required for encoding the amplitude of every pulse sample. For example, in the $frame_n$, the maximum amplitude of pulse samples is 4, and 3 bits are required for encoding the amplitude "4" through natural binary codes, and therefore, a=3. The result of encoding the amplitude "3" is 011, the result of encoding the amplitude "4" is 100, and a total of 6 bits are required for encoding the amplitudes of two pulse samples.

The dynamic range coding method in the prior art may be applied here to encode the pulse samples. For example, if the minimum value of the pulse sample is 3 and the maximum value of pulse sample is 4, 1 bit is required for encoding the difference between the minimum value and the maximum value, 2 bits are required for encoding the two pulse samples, and 2 extra bits are required for representing the minimum value "3", and therefore, a total of 4 bits are required for encoding the amplitudes of two pulse points in the $frame_n$.

Nevertheless, the difference between the amplitude of a pulse sample and the amplitude of a non-pulse sample may be encoded, or the amplitude of the pulse sample is encoded in other modes. For ease of description, the natural binary coding mode is used as an example above. It is understandable to those skilled in the art that the coding mode for the amplitude of the pulse sample may be an entropy coding mode such as Huffman coding and Rice coding, which is not limited herein.

(2) Encoding the Position of a Pulse Sample

The number b of bits required for encoding the position of the pulse sample is calculated. In the $frame_n$, there are ten samples which represent ten positions and require 4 bits (3 bits represent a maximum of 8 positions, and 4 bits represent a maximum of 16 positions). Therefore, b=4. The two pulse samples are located in position 5 and position 8, and their position offset relative to the first sample are 4 and 7 respectively. "4" and "7" are encoded through 4 bits to obtain the position codes of the two pulse samples, namely, "0100" and "0111" respectively.

The coding results of (1) and (2) above are multiplexed. After the two pulse samples in the $frame_n$ are encoded, the first data stream is as follows (it is assumed that the amplitudes of the pulse samples are encoded in the aforementioned first mode): [011][0100][100][0111].

The brackets above are not real contents in the data stream, but are designed for clarity of description only. The first part [011] represents the amplitude of the first pulse sample, the second part [0100] represents the relative position of the first pulse sample, the third part [100] represents the amplitude of the second pulse sample, and the fourth part [0111] represents the relative position of the second pulse sample, totaling 14 bits.

S104: Multiplex the first data stream and the second data stream to obtain an output coded data stream of the input data frame.

The first data stream and the second data stream obtained in S103 are multiplexed. The multiplexing result is the output coded data stream of the $frame_n$. Nevertheless, the output coded data stream needs to carry the coding mode information of this data frame. The coding mode information indicates that the data frame is encoded in the first coding mode with the second coding mode, and the coding mode information is used by the decoder.

It is noted that if the number of pulse samples is 0 as described in S102, the first data stream is null; the output coded data stream of the input data frame obtained after multiplexing of the first data stream and the second data stream is the second data stream. That is, only the non-pulse samples need to be encoded, and the code streams of the non-pulse samples are used as the output coded data streams of the data frame directly. The output coded data stream of this frame needs to carry the coding mode information of this data frame. The coding mode information that the data frame is encoded in the second coding mode, and the coding mode information is used by the decoder.

Figure 2:
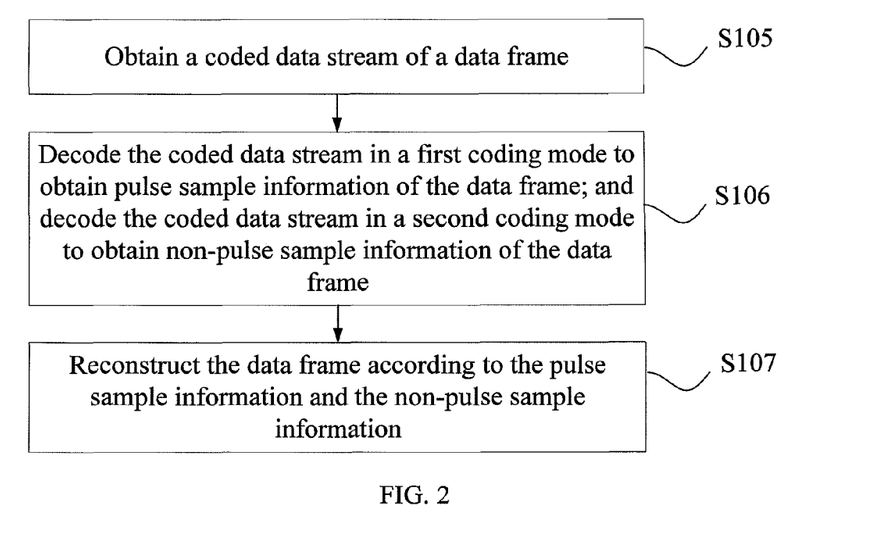
FIG. 2 is a flowchart of a decoding method in the first embodiment of the present disclosure.

Corresponding to the foregoing coding method, a decoding method is provided in an embodiment of the present disclosure. As shown in FIG. 2, the decoding method includes the following steps:

S105: Obtain a coded data stream of a data frame.

S106: Decode the coded data stream in a first coding mode to obtain pulse sample information of the data frame; and decode the coded data stream in a second coding mode to obtain non-pulse sample information of the data frame.

Still taking the data frame encoded in S103 as an example, the coded data stream is demultiplexed according to the multiplexing mode in S104 to obtain the first data stream and the second data stream.

The second data stream "0 1 1 1 0 0 1 0" is decoded in the second coding mode, namely, the values 0 in the second data stream are decoded to 0 and the values 1 in the second data stream are decoded to 2 to obtain the decoded non-pulse sample sequence "0 2 2 2 0 0 2 0".

The first data stream "01101001000111" is decoded in the first coding mode. Because a=3 and b=4, the first data stream includes four parts:

The first part [011] includes 3 bits, which represent the amplitude of the first pulse sample and are decoded to 3;

the second part [0100] includes 4 bits, which represent the relative position of the first pulse sample and are decoded to 4;

the third part [100] includes 3 bits, which represent the amplitude of the second pulse sample and are decoded to 4; and the fourth part [0111] includes 4 bits, which represent the relative position of the second pulse sample and are decoded to 7.

S107: Reconstruct the data frame according to the pulse sample information and the non-pulse sample information.

In S106, the decoding process outputs 8 non-pulse samples, whose amplitudes are 0 2 2 2 0 0 2 0, and outputs two pulse samples, whose amplitudes are 3 and 4. The position offsets of the two pulse samples relative to the first sample in the frame are 4 and 7. That is, in the reconstructed data frame, the fifth sample is a pulse sample whose amplitude is 3, and the eighth sample is a pulse sample whose amplitude is 4. Then, the amplitudes of the eight pulse samples are written into the remaining positions of the reconstructed data frame. Finally, the reconstructed data frame is 0 2 2 2 3 0 0 4 2 0.

It is noted that if the number of pulse samples is 0 as described in S102, the decoder may know that the frame is encoded in the second coding mode according to the coding mode information of the data frame. Therefore, the first data stream of this frame is null, it is necessary to only decode amplitudes of all non-pulse samples in the second coding mode, and the amplitudes of the non-pulse samples are used directly to reconstruct the data frame.

Through the solution in this embodiment, a total of 8+14=22 bits are required for encoding the frame$_n$ (without including the code mode information). If the dynamic range coding scheme in the prior art is applied, the dynamic range of the frame$_n$ is 4, and 3 bits are required for encoding each sample, 30 bits are required for encoding the ten samples in total. Therefore, the technical solution in this embodiment improves the efficiency of compressing the data frame with a wide dynamic range, processes pulse samples and non-pulse samples separately, decreases the number of bits required for encoding each non-pulse sample significantly, and improves the efficiency of encoding non-pulse samples.

Embodiment 2

Figure 3:
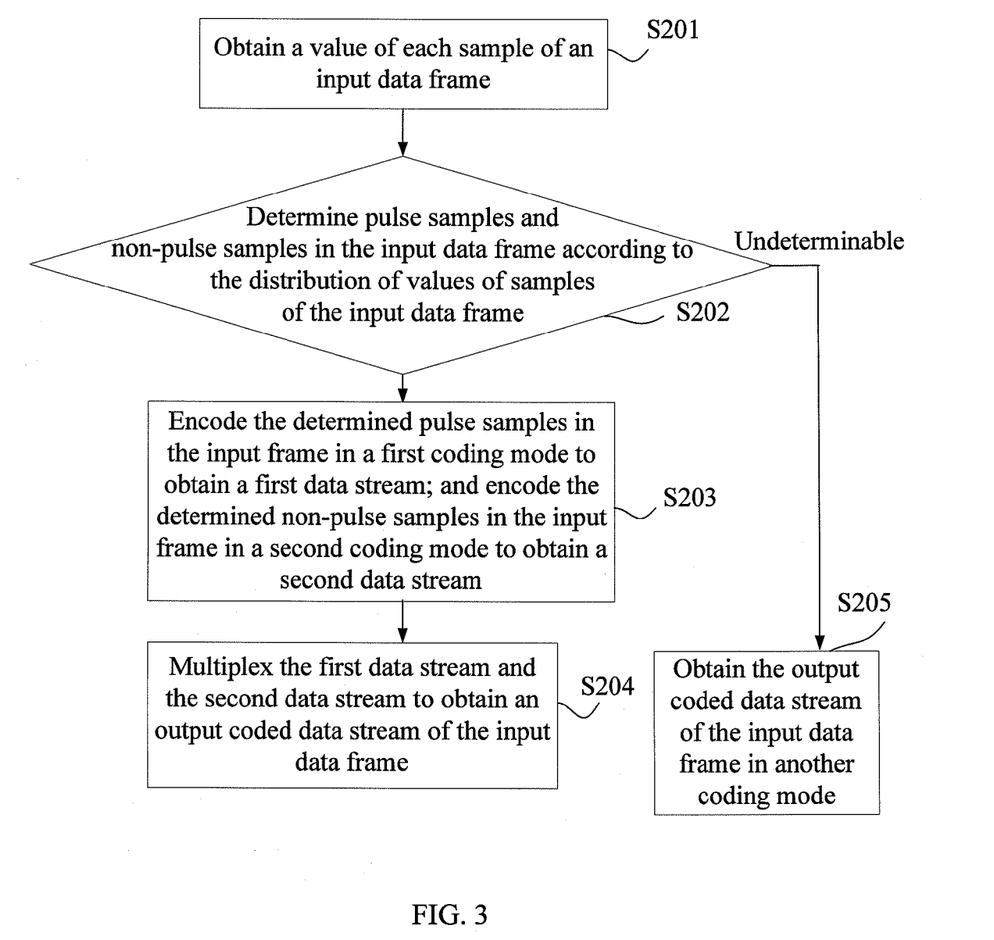
FIG. 3 is a flowchart of a coding method in the second embodiment of the present disclosure.

The solution described in the first embodiment is applicable to the data frame, in which most samples are centralized to a few values and only a few samples have different values. In practice, many data frames to be encoded do not have such characteristics. For the data frames without such characteristics, other coding modes in the prior art may be applied. As shown in FIG. 3, in the method provided in this embodiment, S201, S203, and S204 are the same as S101, S103, and S104 respectively. The only difference between the two embodiments is the judgment step S202. In S202, if it is impossible to determine pulse samples and non-pulse samples, S205 needs to be performed, and the output coded data stream of the input data frame is obtained through other coding modes such as dynamic range coding in the prior art.

Preferably, the following step is added between S201 and S202: Judge whether the sample value of the input data frame is a constant. If the sample value of the input data frame is a constant, encode the input data frame in the constant coding mode; if the sample value of the input data frame is not a constant, perform S202.

Whether the pulse samples and the non-pulse samples in an input data frame are determinable depends on the value of the threshold K. As mentioned in the first embodiment, to ensure the coding efficiency, the value K is not very great; or further, the samples finally determined as pulse samples in the data frame do not exceed a specific proportion.

In practice, according to the empiric data, a small value is selected as the value K, for example, K=2 or K=4. Alternatively, the value K is estimated according to the following inequality: $K<(P-Q)/(a+b)$, where P is the number of bits required for encoding the entire data frame (L samples in total) in another coding method, Q is the number of bits required for encoding L-K samples in the bi-level coding method, "a" is the number of bits required for encoding the amplitude of a pulse, and "b" is the number of bits required for encoding the relative position of a pulse.

For example, it is assumed that L=16, and the number of bits required for encoding each sample in the dynamic range coding mode is 8:

P=16*8=128 bits;

Q=(16−K) bits;

according to predictive calculation, a=4 bits, and b=8 bits. Put the values of P, Q, a, and b into the foregoing inequality:

K<(128−(16−K))/12

As a result, K<10.1.

That is, when L=16, if ten pulse samples are determined in a data frame, the coding efficiency based on the coding scheme in this embodiment is almost the same as the coding efficiency based on the dynamic range coding scheme. With the decrease of the value K, the coding efficiency based on the coding scheme in this embodiment is higher, but the applicable scope is narrower. For example, if the threshold K=8, the data frames with K=9 and K=10 undergo other coding modes, as described in S205. In practice, the characteristics of the data frame, the coder efficiency, and the complexity are taken into account altogether to determine the value of the threshold K.

In the foregoing embodiment, for ease of description, the non-pulse samples are encoded in the simple 0/1 bi-level coding mode, namely, 0 and 1 represent two non-pulse sample values. It is understandable to those skilled in the art that the non-pulse samples may be encoded in a run-length bi-level coding mode. Moreover, the run-length coding information may be further encoded through an entropy coding mode such as Huffman coding and Rice coding.

Embodiment 3

Figure 4:
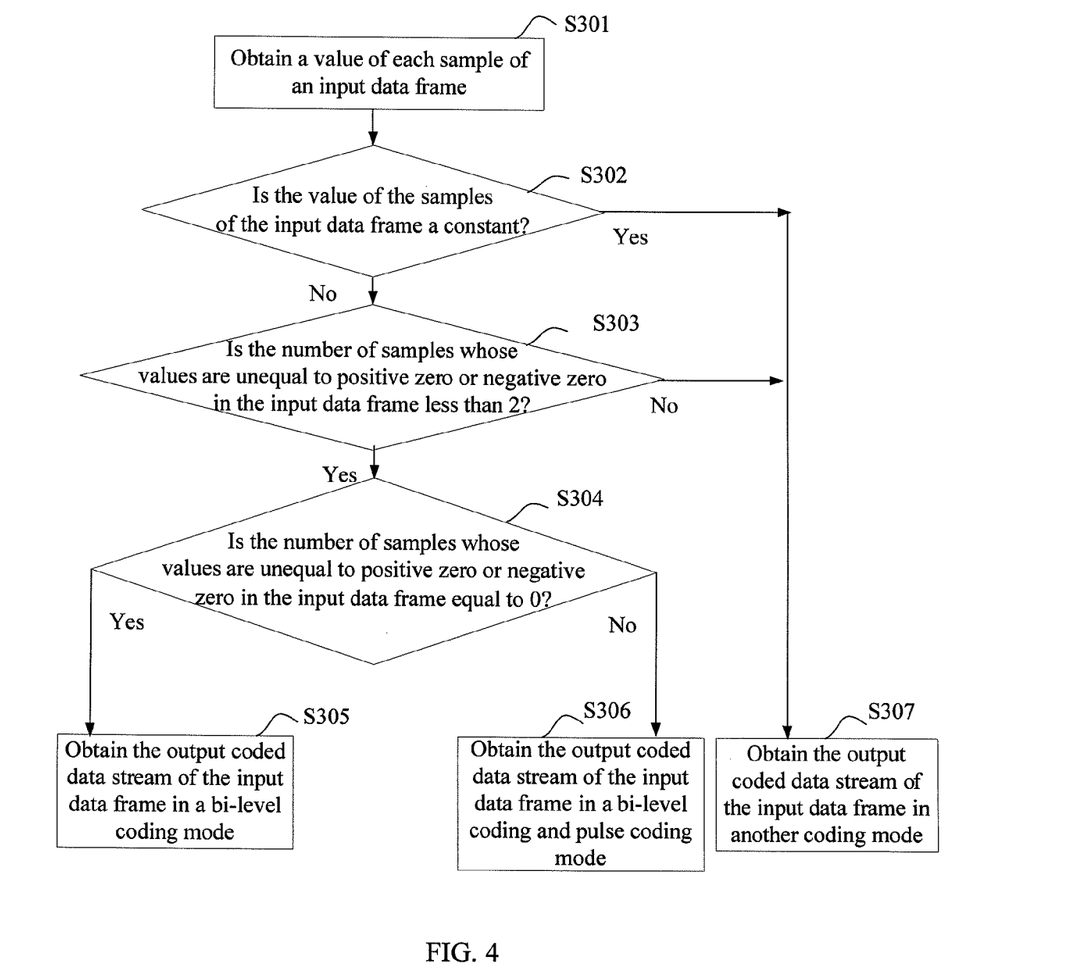
FIG. 4 is a flowchart of a coding method in the third embodiment of the present disclosure.

The coding method under the present disclosure is described below with reference to an embodiment. FIG. 4 is a flowchart of a lossless compression coding method for G.711 code streams. The method includes the following steps:

S301: Obtain a value of each sample of an input data frame.

The coder obtains the value of each sample in the G.711 data frame after receiving the data frame.

S302: Judge whether the value of the samples of the input data frame is a constant. If the value of the samples is not a constant, perform S303; if the value of the samples is a constant, perform S307.

S303: Judge whether the number of samples whose values are unequal to positive zero or negative zero in the input data frame is less than 2. If the number of samples whose values are unequal to positive zero or negative zero in the input data frame is less than 2, perform S304; if the number of samples is greater than or equal to 2, perform S307.

In the ITU-T G.711 standard, A-law or μ law is used to encode audios. For the code streams under the G.711 standard, it is highly probable that the sample value is positive zero or negative zero. Therefore, let V0 be a positive zero and let V1 be a negative zero. The range of the sample values of the G711 code stream is [0, 0xff]. The positive zero defined by the A law is represented by 0xd5, and the negative zero defined by the A law is represented by 0x55; the positive zero defined by the μ law is represented by 0xff, and the negative zero defined by the μ law is represented by 0x7f.

In this embodiment, the threshold K is empirically set to 2, namely, when the number of samples whose values are unequal to positive zero or negative zero in the data frame is less than 2, the data frame is encoded according to the solution provided in this embodiment (S304 and subsequent steps); when the number of samples whose values are unequal to positive zero or negative zero in the data frame is greater than or equal to 2, the data frame is encoded in another coding mode (S307).

S304: Judge whether the number of samples whose values are unequal to positive zero or negative zero in the input data frame is equal to 0. If the number of samples whose values are unequal to positive zero or negative zero in the input data frame is equal to 0, perform S305; if the number of such ample points is unequal to 0, perform S306.

S305: Obtain the output coded data stream of the input data frame in the bi-level coding mode.

When the number of samples whose values are unequal to positive zero or negative zero in the input data frame is equal to 0, namely, only two types of sample values (positive zero and negative zero) exist in the input data frame, the data frame is encoded in the bi-level coding mode. If the change frequency of the sample value is high, the 0/1 bi-level coding mode may be applied, namely, the positive zero and the negative zero are encoded to 0 and 1 (or, 1 and 0). If the change frequency of the sample value is low, namely, a series of positive zeros or negative zeros occur frequently, the run-length bi-level coding method may be applied. The run-length bi-level coding method is described below.

S305a: Analyze the run-length coding information.

The number of positive-zero samples is compared with the number of negative-zero samples. If the number of positive-zero samples is greater than the number of negative-zero samples, two reference values are set: more_value=positive zero, and less_value=negative zero. If the number of negative-zero samples is greater than the number of positive-zero samples, two reference values are set: more_value=negative zero, and less_value=positive zero. The sequential values of number of running more_value values and less_value values are calculated out as run-length coding information. For example, for the data frame encoded through the A law, the frame length L=40, and the order of the sample values is: fifteen positive zeros in series, five negative zeros in series, eighteen positive zeros in series, and two negative zeros in series. Therefore, let more_value=0x55, and let less_value=0x55. The run-length coding information may be expressed as ((0xd5, 15), (0b x55, 5), (0xd5, 18), (0x55, 2)).

S305b: Encode the run-length coding information.

For the foregoing run-length information, the number of running more_value values and the number of running less_value values, that is, 15, 5, 18, 2, may be encoded directly, or m−1 running 0s and the number of running more_value values may be used together as the run-length information, which is then encoded (m represents the number of running less_value values that occur in series after the more_value value). For example, ((0xd5, 15), (0x55, 5), (0xd5, 18), and (0x55, 2)) may be further expressed as (15, 0, 0, 0, 0, 18, 0), where 15 represents the number of running more_value values, and the subsequent four 0 represent five running less_value values after the more_value value; 18 represents the number of running more_value values, and the subsequent one 0 represents two running less_value values after the more_value value.

This embodiment uses the rice coding method to encode the run-length information. The parameter "s" of rice coding is estimated according to the run-length coding information, and then the coding based on the s parameter is performed for the information. For example, for the run-length coding information (15, 0, 0, 0, 0, 18, 0), the final coding result may be expressed as: rice_encode((15, 0, 0, 0, 0, 18, 0), s).

The estimated s value also needs to be encoded in the natural binary coding mode or Huffman coding mode. The coding result of the s value and the coding result of the run-length coding information are multiplexed together as the coded output data stream of this data frame. An s value that occurs infrequently may be reserved for marking the bi-level coding and pulse coding mode in S306. For example, if the s=1 seldom occurs, the s=1 is reserved. If it is estimated that s=1 should be used according to the run-length coding information, the s value for encoding this frame is set to a value proximate to 1 (for example, s=0 or s=2), and then the proximate value (s=0 or s=2) is used to encode the run-length coding information of this frame. In the case that the s=0 seldom occurs and the change frequency of the sample value is high, s=0 is reserved. If the s=0 is estimated for a data frame according to the run-length coding information, this frame is encoded in the 0/1 bi-level coding mode directly. In the following description, it is assumed that s=0.

When the length of the input data frame is L, L bits are required for encoding the entire data frame (without including the pulse samples) in the 0/1 bi-level coding mode. If it is predicted that the number of bits required for encoding in the run-length bi-level coding mode is less than L, the input data frame is encoded in the run-length bi-level coding mode. Otherwise, the 0/1 bi-level coding mode is applied.

S306: Obtain the output coded data stream of the input data frame in the bi-level coding and pulse coding mode.

If the number of samples whose values are unequal to positive zeros or negative zeros in the input data frame is equal to 1, the data frame is encoded in the bi-level coding and pulse coding mode.

The non-pulse samples may be encoded in a way similar to S305. For the pulse samples, the amplitude and the relative position of each pulse sample need to be encoded.

In this embodiment, only one pulse amplitude exists. The difference between the pulse amplitude pulse_value and the more_value and the difference between the pulse_value and the less_value are worked out. The two differences are compared to obtain a smaller difference, the comparison result is represented by 1 bit, and the smaller difference is encoded in the rice method.

The frame length L of a G.711 code stream have many values such as L=40, L=80, L=160, L=240, and L=320. When L=40, the relative position information is encoded through 6 bits; when L=80, it is encoded through 7 bits; when L=160/240, it is encoded through 8 bits; when L=320, it is encoded through 9 bits. For the detailed method of encoding the relative position of the pulse sample, see (2) in S103.

The data frame encoded in the bi-level coding and pulse coding mode may be identified by a reserved s value. As mentioned in s305b, the reserved s=0 may be used to identify that the data frame is encoded in a bi-level coding and pulse coding mode.

S307: Obtain the output coded data stream of the input data frame in another coding mode.

When the sample value of the input data frame is a constant or falls outside the scenario that "most sample values are positive zeros or negative zeros, and a few sample values are other values", another coding mode (such as predictive coding, dynamic range coding, and constant coding) is applied according to the specific conditions of this frame to obtain the output coded data stream of the input data frame, and information indicative of the data frame coding mode is added into the output coded data stream.

It is evident to those skilled in the art that the rice coding mode mentioned in this embodiment may be replaced with another entropy coding mode, which does not affect the implementation of the solution under the present disclosure.

A lossless compression coding method for G.711 code streams is provided in an embodiment of the present disclosure. In this method, the data frames of the G.711 code stream are sorted into four types which employ different coding modes:

(1) for constant data frames, the constant coding mode is applied;

(2) for bi-level data frames (positive zero and negative zero), the bi-level coding mode is applied;

(3) for the data frames of a pulse value, the bi-level coding and pulse coding mode is applied; and (4) for the data frames other than (1), (2), and (3) above, the predictive coding mode or the dynamic range coding mode is applied.

The bi-level coding mode and the bi-level coding and pulse coding mode can reduce the bits of the output code data, and improve the coding efficiency.

Figure 5:
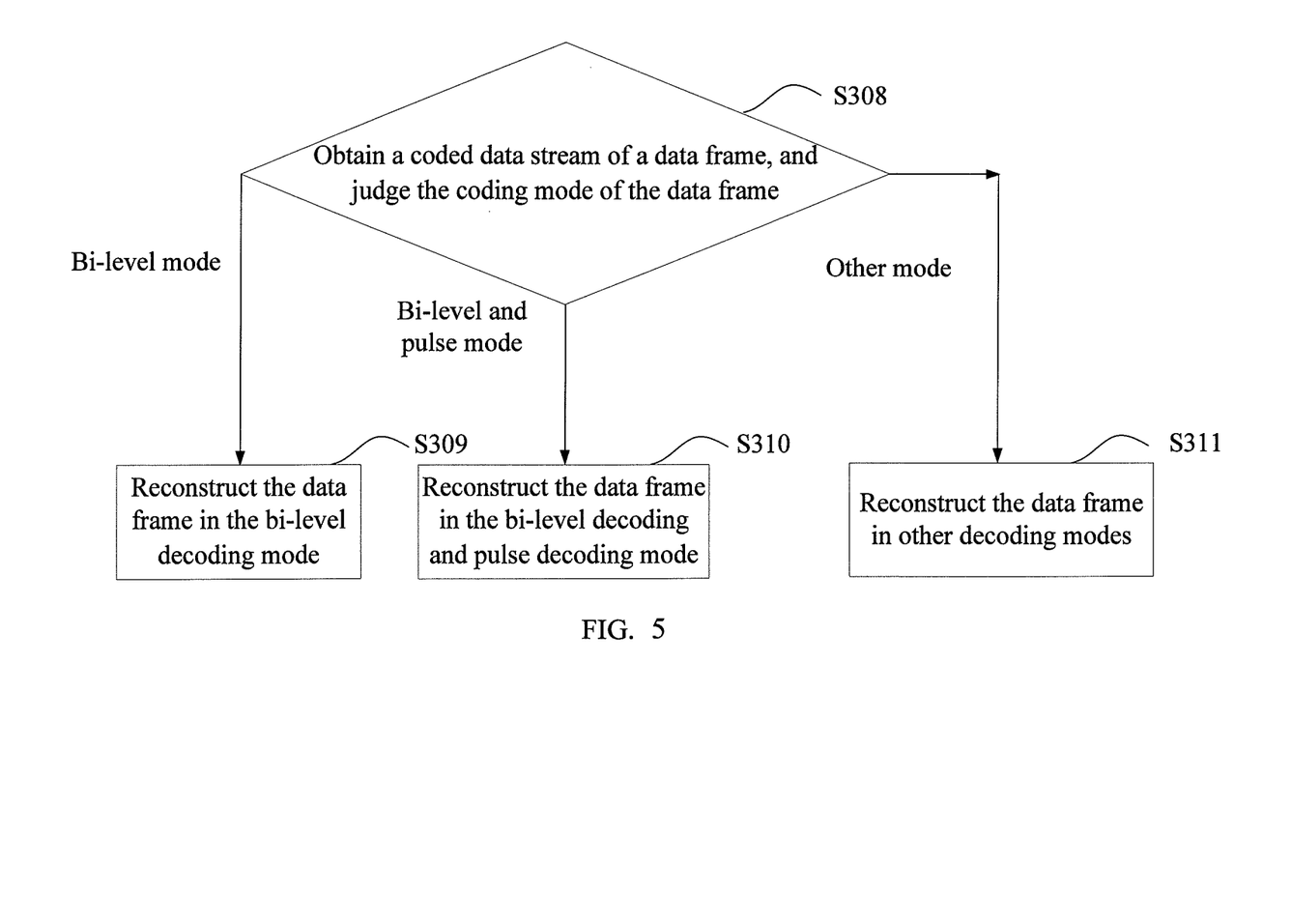
FIG. 5 is a flowchart of a decoding method in the third embodiment of the present disclosure.

Corresponding to the foregoing coding method, a decoding method is provided in an embodiment of the present disclosure. As shown in FIG. 5, the decoding method includes the following steps:

S308: Obtain a coded data stream of a data frame, and judge the coding mode of the data frame.

After receiving the coded data stream of a data frame, the decoder decodes the data frame to obtain the coding mode information which indicates the coding mode of the frame. The bi-level coding mode is differentiated from the bi-level coding and pulse coding mode according to the s value. If s is not equal to 0, it indicates that the data frame is encoded in the bi-level coding mode, and S309 needs to be performed; if s is equal to 0, it indicates that the data frame is encoded in the bi-level coding and pulse coding mode, and S310 needs to be performed. If the decoding result reveals that the data frame is encoded in other coding modes, S311 needs to be performed.

S309: Reconstruct the data frame in the bi-level decoding mode.

The coded data stream is decoded to a sample sequence of positive zeros and negative zeros, and the sample sequence is used as the reconstructed data frame.

S310: Reconstruct the data frame in the bi-level decoding and pulse decoding mode.

The coded data stream is decoded to a sample sequence of positive zeros and negative zeros, and to the amplitude and the relative position of the pulse sample. Then, according to the relative position of the pulse sample, the pulse sample is combined into the sample sequence of positive zeros and negative zeros to obtain the reconstructed data frame.

S311: Reconstruct the data frame in other decoding modes.

The decoding method corresponding to other coding modes (such as predictive coding, dynamic range coding, and constant coding) in S307 is applied to obtain the reconstructed data frame.

For ease of description, the embodiments of the present disclosure are based on this typical scenario: Most samples are centralized to two values. It is evident to those skilled in the art that: When most samples in the data frame are centralized to 1 values, 2 values, 3 values, 4 values, and so on, the technical solution under the present disclosure is also applicable. In such scenarios, the samples in the data frame are sorted into two types, namely, pulse samples and non-pulse samples, according to the distribution of the values of the samples of the data frame, and then the two types of samples are encoded respectively to improve the coding efficiency, which also falls within the protection scope of the present disclosure.

It is understandable to those skilled in the art that all or part of the steps of the foregoing method embodiments may be implemented by hardware instructed by a program. The program may be stored in a computer-readable storage medium. When being executed, the program performs steps of the foregoing method embodiments. The storage medium may be any medium suitable for storing program codes, for example, Read Only Memory (ROM), Random Access Memory (RAM), magnetic disk, or Compact Disk (CD).

Embodiment 4

Figure 6:
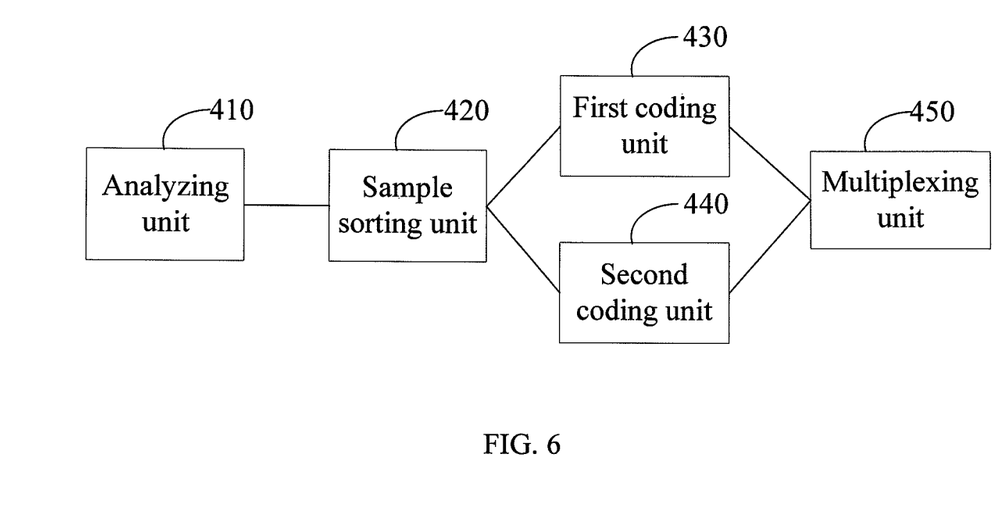
FIG. 6 shows a structure of a coding apparatus in the embodiment of the present disclosure.

A coding apparatus corresponding to the method embodiment above is provided in this embodiment. As shown in FIG. 6, the coding apparatus includes: an analyzing unit 410, a sample sorting unit 420, a first coding unit 430, a second coding unit 440, and a multiplexing unit 450.

The Analyzing unit 410 is adapted to obtain a value of each sample of an input data frame.

In the technical solution under the present disclosure, the input data is encoded per frame. A data frame is composed of several samples, and each sample has a value. After receiving the data frame, the coding apparatus obtains the value of each sample first through the analyzing unit 410.

The sample sorting unit 420 is adapted to determine pulse samples and non-pulse samples in the input data frame according to the distribution of values of samples of the input data frame.

Many data frames in the audio signals have the following characteristics: A majority of samples in the data frame are centralized to a few values, and the values of only a few samples are different from the values of other samples. In view of such characteristics, the samples are sorted into two types in this embodiment, and the two types of samples are encoded differently. In a data frame, the few samples, whose values are different from the values of other samples, are called pulse samples, and the remaining samples are called non-pulse samples.

To identify pulse samples and non-pulse samples in a data frame, it is necessary to determine the values which occur frequently in the data frame. The frequently occurring sample values may be predetermined according to the empirical data of the sample value distribution. Alternatively, the values of frequently occurring samples are determined in real time according to the distribution of the values of the samples of the input data frame.

For example, two values occur frequently in a data frame. Let the two values be V0 and V1. The sample sorting unit 420 may include: a bi-level determining sub-unit and a sample sorting sub-unit.

The bi-level determining sub-unit is adapted to determine the two values V0 and V1 that occur the most frequently in the samples of the input data frame. For example, the data frame (frame$_n$) includes ten samples whose values are 0, 2, 2, 2, 3, 0, 0, 4, 2, and 0. In this data frame, the most frequently occurring two sample values are 0 and 2. Therefore, let V0 be 0 and let V1 be 2.

The sample sorting sub-unit sorts the samples into pulse samples and non-pulse samples. If the number of samples whose values are unequal to V0 and unequal to V1 in the input data frame is less than the preset threshold, the sample sorting sub-unit determines the samples whose values are unequal to V0 and unequal to V1 as pulse samples, and determines the samples whose values are equal to V0 or V1 as non-pulse samples. In the frame$_n$, the number of samples whose values are unequal to V0 and unequal to V1 is 2 (namely, the samples whose values are 3 or 4). If 2 is less than the preset threshold K, the two samples whose values are 3 or 4 are determined as pulse samples, and the samples whose values are 0 or 2 are determined as non-pulse samples.

If the number of samples whose values are unequal to V0 and unequal to V1 is 0, because 0 is surely less than K, the samples whose values are equal to V0 or V1 are still determined as non-pulse samples, and it is deemed that the number of determined pulse samples is 0.

The first coding unit 430 is adapted to encode the determined pulse samples in the input data frame in a first coding mode to obtain a first data stream.

More specifically, the pulse sample may be encoded in this way: encode the amplitude of the pulse sample and the relative position of the pulse sample in the original data frame in the first coding mode.

(1) Encoding the Amplitude of a Pulse Sample

The number a of bits required encoding the amplitude of each pulse sample is calculated. The most simple calculation method is to find the pulse sample whose amplitude has the maximum absolute value. The number of bits required for encoding the amplitude of this sample is used as the number of bits required for encoding the amplitude of every pulse sample. For example, in the frame$_N$, the maximum amplitude of the pulse samples is 4, and 3 bits are required for encoding the amplitude "4" through the natural binary codes, and therefore, a=3. The result of encoding the amplitude "3" is 011, the result of encoding the amplitude "4" is 100, and a total of 6 bits are required for encoding the amplitudes of two pulse samples.

The dynamic range coding method in the prior art may apply here to encode the pulse samples. For example, if the minimum value of the pulse sample is 3 and the maximum value of pulse sample is 4, 1 bit is required for encoding the difference between the minimum value and the maximum value, 2 bits are required for encoding the two pulse samples, and 2 extra bits are required for representing the minimum value "3", and therefore, a total of 4 bits are required for encoding the amplitudes of two pulse points in the frame$_n$.

Nevertheless, the difference between the amplitude of a pulse sample and the amplitude of a non-pulse sample may be encoded, or the amplitude of the pulse sample is encoded in other modes. For ease of description, the natural binary coding mode is used as an example above. It is understandable to those skilled in the art that the first coding unit 430 may encode the amplitude of the pulse sample through an entropy coding mode such as Huffman coding and Rice coding, which is not limited herein.

(2) Encoding the Position of a Pulse Sample

First, the number b of bits required for encoding the position of the pulse sample is calculated. In the frame$_n$, there are ten samples which represent 10 positions and require 4 bits (3 bits represent a maximum of 8 positions, and 4 bits represent a maximum of 16 positions). Therefore, b=4. The two pulse samples are located in position 5 and position 8, and their position offset relative to the first sample are 4 and 7 respectively. "4" and "7" are encoded through 4 bits to obtain the position codes of the two pulse samples, namely, "0100" and "0111" respectively.

The coding results of (1) and (2) above are multiplexed. After the two pulse samples in the frame$_n$ are encoded, the first data stream is as follows (it is assumed that the amplitudes of the pulse samples are encoded in the aforementioned first mode): [011][0100][100][0111].

The brackets above are not real contents in the data stream, but are designed for clarity of description only. The first part [011] represents the amplitude of the first pulse sample, the second part [0100] represents the relative position of the first pulse sample, the third part [100] represents the amplitude of the second pulse sample, and the fourth part [0111] represents the relative position of the second pulse sample, totaling 14 bits.

The second coding unit 440 is adapted to encode the determined non-pulse samples in the input data frame in a second coding mode to obtain a second data stream.

More specifically, the non-pulse samples may be encoded in this way: encode the amplitude of each non-pulse sample in the second coding mode. For example, if the non-pulse samples have two types of amplitudes V0 and V1, 1 bit may be used to encode each non-pulse sample, namely, perform bi-level coding for the non-pulse samples.

The multiplexing unit 450 is adapted to multiplex the first data stream and the second data stream to obtain an output coded data stream of the input data frame.

The result of multiplexing the first data stream and the second data stream is the output coded data stream of the frame$_n$. Nevertheless, the output coded data stream needs to carry the coding mode information of this data frame. The coding mode information indicates that the data frame is encoded in the first coding mode with the second coding mode, and the coding mode information is used by the decoder.

If the sample sorting unit 420 determines that the number of pulse samples is 0, the first data stream is null, and the output coded data stream of the input data frame after multiplexing of the first data stream and the second data stream is the second data stream. The output coded data stream of this frame needs to carry the coding mode information of this frame, and the coding mode information indicates that the frame is encoded in the second coding mode. The coding mode information is used by the decoder.

Figure 7:
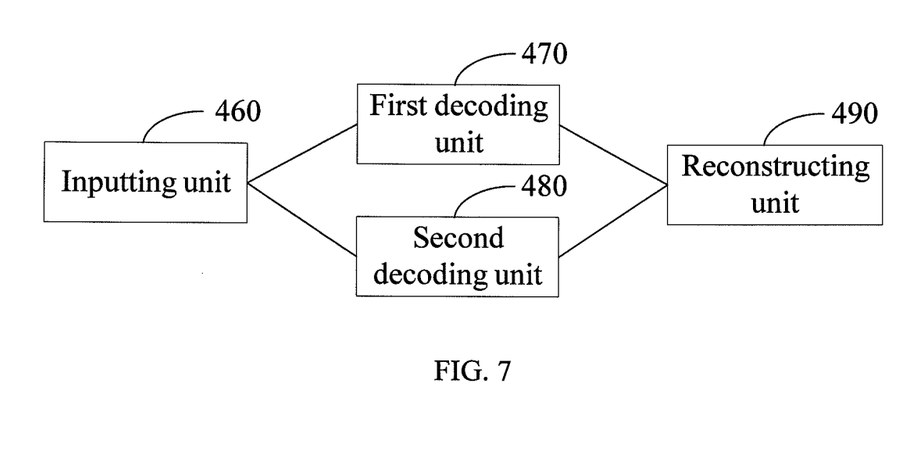
FIG. 7 shows a structure of a decoding apparatus in the embodiment of the present disclosure.

A decoding apparatus is provided in an embodiment of the present disclosure. As shown in FIG. 7, the decoding apparatus includes: an inputting unit 460, a first decoding unit 470, a second decoding unit 480, and a reconstructing unit 490.

The inputting unit 460 is adapted to obtain a coded data stream of a data frame.

The first decoding unit 470 is adapted to decode the coded data stream in a first coding mode to obtain pulse sample information of the data frame.

For example, the first data stream "01101001000111" in the coded data stream is decoded in the second coding mode. Because a=3 and b=4, the first data stream includes four parts:

The first part [011] includes 3 bits, which represent the amplitude of the first pulse sample and are decoded to 3;

the second part [0100] includes 4 bits, which represent the relative position of the first pulse sample and are decoded to 4;

the third part [100] includes 3 bits, which represent the amplitude of the second pulse sample and are decoded to 4; and the fourth part [0111] includes 4 bits, which represent the relative position of the second pulse sample and are decoded to 7.

The second decoding unit 480 is adapted to decode the coded data stream in a second coding mode to obtain non-pulse sample information of the data frame.

For example, the second data stream "0 1 1 1 0 0 1 0" in the coded data stream is decoded in the second coding mode, namely, the second decoding unit decodes the values 0 in the second data stream to 0 and decode the values 1 in the second data stream to 2 to obtain the decoded non-pulse sample sequence "0 2 2 2 0 0 2 0".

The reconstructing unit 490 is adapted to reconstruct the data frame according to the pulse sample information and the non-pulse sample information.

The first decoding unit 470 outputs eight non-pulse samples, whose amplitudes are 0 2 2 2 0 0 2 0, and the second decoding unit 480 outputs two pulse samples, whose amplitudes are 3 and 4. The position offsets of the two pulse samples relative to the first sample in the frame are 4 and 7. That is, in the reconstructed data frame, the fifth sample is a pulse sample whose amplitude is 3, and the eighth sample is a pulse sample whose amplitude is 4. Then, the amplitudes of the eight pulse samples are written into the remaining positions of the reconstructed data frame. Finally, the reconstructed data frame is 0 2 2 2 3 0 0 4 2 0.

It is noted that if the first data stream is null, it is necessary for the second decoding unit 480 to only decode amplitudes of all non-pulse samples in the second coding mode, and the reconstructing unit 490 uses the amplitudes of the non-pulse samples directly to reconstruct the data frame.

The decoding apparatus provided in this embodiment sorts the samples in the data frame into two types, namely, pulse samples and non-pulse samples, then encodes the two types of samples separately, and finally multiplexes the coding results of the two types of samples to obtain the output coded code stream of the input data frame. After the pulse samples are excluded, the dynamic range of the non-pulse samples is controlled, the number of bits required for encoding each non-pulse sample is reduced, and the coding efficiency of the non-pulse samples is improved. Meanwhile, for the few pulse samples which may increase the dynamic range of the entire data frame, few bits may be used to encode them separately. Compared with the prior art, the technical solution under the present disclosure reduces the number of bits required for encoding the entire data frame, and improves the compression efficiency.

The apparatus embodiments corresponding to the method embodiments are described briefly herein because the relevant contents can be derived from the method embodiments. The apparatus embodiments described above are for the exemplary purpose only. The units described as stand-alone components may be physically separated or not; and the components displayed as units may be physical units or not, namely, may be located in the same position or distributed on multiple network units. Some or all of the modules described above may be selected as required to fulfill the objectives of the technical solution under the present disclosure. Those skilled in the art can understand and implement the technical solution without making any creative effort.

Although the disclosure is described through some exemplary embodiments, the disclosure is not limited to such embodiments. It is apparent that those skilled in the art can make modifications and variations to the disclosure without departing from the spirit and scope of the disclosure. The disclosure is intended to cover the modifications and variations provided that they fall in the scope of protection defined by the following claims or their equivalents.

What is claimed is:

1. A coding method, comprising:
   obtaining a value of each sample of an input data frame;
   determining whether any of the samples is a pulse sample;
   encoding at least one pulse sample in the input data frame in a first coding mode to obtain a first data stream when at least one pulse sample is identified;
   encoding non-pulse samples in the input data frame in a second coding mode to obtain a second data stream; and
   multiplexing the first data stream and the second data stream to obtain an output coded data stream of the input data frame,
   wherein the pulse sample is identified when the number of samples having a value not equal to a first and a second most frequently occurring incidence of sample values is less than a predetermined threshold, and
   wherein a non-pulse sample is identified when the sample value is equal to at least one of the first and the second most frequently occurring incidence of sample values.

2. The method according to claim 1, wherein the input data frame is a G.711 data frame.

3. The method according to claim 1, wherein V0 is positive zero, and wherein V1 is negative zero.

4. A non-transitory computer-readable medium having computer usable instructions stored thereon for execution by a processor, wherein the instructions cause the processor to:
   obtain a value of each sample of an input data frame;
   determine whether any of the samples is a pulse sample;
   encode at least one pulse sample in the input data frame in a first coding mode to obtain a first data stream when at least one pulse sample is identified;
   encode non-pulse samples in the input data frame in a second coding mode to obtain a second data stream; and
   multiplex the first data stream and the second data stream to obtain an output coded data stream of the input data frame,
   wherein the pulse sample is identified when the number of samples having a value not equal to a first and a second most frequently occurring incidence of sample values is less than a predetermined threshold, and
   wherein a non-pulse sample is identified when the sample value is equal to at least one of the first and the second most frequently occurring incidence of sample values.

* * * * *